United States Patent
Nagaraj et al.

(10) Patent No.: US 8,339,295 B2
(45) Date of Patent: Dec. 25, 2012

(54) METHOD AND SYSTEM FOR MANAGING DIGITAL TO TIME CONVERSION

(75) Inventors: Geetha B. Nagaraj, Coral Springs, FL (US); Nicholas G. Cafaro, Coconut Creek, FL (US); Ralf Hekmann, Chicago, IL (US); Robert E. Stengel, Pompano Beach, FL (US); Scott Miller, College Station, TX (US)

(73) Assignee: Motorola Solutions, Inc., Schaumburg, IL (US)

( * ) Notice: Subject to any disclaimer, the term of this patent is extended or adjusted under 35 U.S.C. 154(b) by 1506 days.

(21) Appl. No.: 11/831,465

(22) Filed: Jul. 31, 2007

(65) Prior Publication Data

US 2009/0033384 A1 Feb. 5, 2009

(51) Int. Cl.
*H03M 1/48* (2006.01)

(52) U.S. Cl. ........ 341/111; 455/296; 455/283; 455/314; 455/333; 455/209; 370/463; 370/419; 717/101; 717/151; 708/270; 708/277; 708/275; 327/105; 327/106; 327/356; 327/359

(58) Field of Classification Search .......... 341/111–117; 717/101, 151; 708/270–277; 327/105–106, 327/356, 359; 455/296, 283, 302, 314, 323, 455/333, 324, 326, 316, 209, 463, 419
See application file for complete search history.

(56) References Cited

U.S. PATENT DOCUMENTS

| | | | |
|---|---|---|---|
| 6,839,551 B1 * | 1/2005 | Wong | 455/314 |
| 6,876,844 B1 * | 4/2005 | Wong | 455/316 |
| 7,151,919 B2 * | 12/2006 | Takalo et al. | 455/323 |
| 7,242,236 B2 * | 7/2007 | Krug et al. | 327/356 |
| 7,409,416 B2 * | 8/2008 | Stengel | 708/270 |
| 7,421,464 B2 * | 9/2008 | Gradishar et al. | 708/271 |
| 7,477,886 B1 * | 1/2009 | Wong | 455/314 |
| 7,636,562 B1 * | 12/2009 | Wong | 455/296 |
| 2003/0218486 A1 | 11/2003 | Kwak | |

FOREIGN PATENT DOCUMENTS

GB 2427086 A 12/2006

OTHER PUBLICATIONS

PCT/US2008/071312—International Search Report with Written Opinion mailed Feb. 16, 2010—12 pages.
PCT/US2008/071312—International Preliminary Report mailed Mar. 4, 2010—8 pages.
Manuel Moto et al—"A High-Resolution Time Iterpolator Based on a Delay Lockedloop and an RC Delay Line"—IEEE JSSC, vol. 34, No. 10, Oct. 1999—pp. 1360-1366.

\* cited by examiner

*Primary Examiner* — Lam T Mai

(74) *Attorney, Agent, or Firm* — Barbara R. Doutre

(57) ABSTRACT

A method and system for managing Digital to Time Conversion (DTC) is provided. The method comprises receiving a first Radio Frequency (RF) signal and a second RF signal. The second RF signal is a phase-shifted first RF signal. The method further comprises converting the first RF signal to a first Intermediate Frequency (IF) signal and the second RF signal to a second IF signal. Further, a time delay between the first IF signal and the second IF signal is estimated based on a time difference measurement technique. The second RF signal is processed based on the estimated time delay to compensate for a delay error associated with the second RF signal.

19 Claims, 4 Drawing Sheets

METHOD AND SYSTEM FOR MANAGING DIGITAL TO TIME CONVERSION

FIELD OF THE INVENTION

The present invention generally relates to Digital to Time conversion. More specifically, the present invention relates to method and system for managing digital to time conversion.

BACKGROUND OF THE PRESENT INVENTION

Some applications such as Direct Digital Synthesizer (DDS) may employ a Delay Locked Loop (DLL) based Digital to Time Converter (DTC), also known as Phase converter, for synthesizing phase-shifted reference signals. The DTC can have a delay line with identical tap delay elements that are locked using the DLL. During a digital to time conversion, the reference signal is passed through the delay line and a tap selection logic is used to select pulses of the reference signal from the outputs of the delay line. Consequently, a plurality of phase-shifted reference signals are generated through the outputs of the delay line. These phase-shifted reference signals can be combined in various ways to obtain output signals of varying frequencies.

Spectral purity of the output signals depends upon the accuracy of the phase-shifted reference signals. In a real scenario, due to finite errors associated with Integrated Chip (IC) manufacturing process, a delay mismatch may exist between the tap delay elements, rendering them non-identical. Due to the mismatch, the time spacing between the phase-shifted reference signals may be unequal. This may lead to generation of discrete spurious signals in the output signal that have a magnitude proportionate to the error in time spacing between the phase-shifted reference signals.

The presence of spurious signals can significantly affect the quality of the output signals. Further these spurious signals are not desirable in many applications such as, a local oscillator in a transceiver system, etc. The spurious signals may cause unwanted signals to appear along with the wanted signals thus degrading system performance.

Some existing state of the art, time based sampling RF system architectures are complex and statistics based and are coupled to the process technology. Other architectures are high-power requirement solutions that necessitate the use of very high speed time interval counters. Consequently, the high-power requirement solutions lead to long duration processing of a large number of time based samples. Moreover, most of the existing solutions require complex frequency domain measurements of time based reference signal synthesis.

Accordingly, it would be desirable to have an improved means of managing digital to time conversion.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
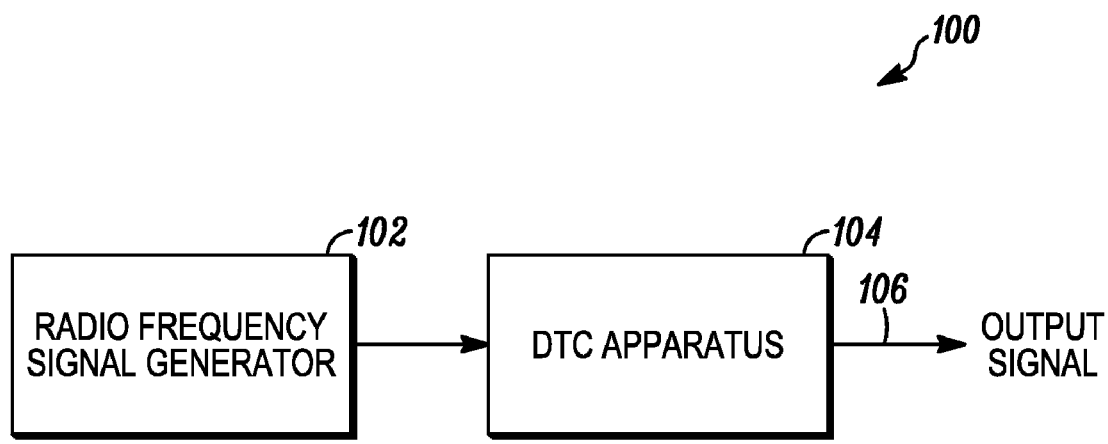
FIG. 1 illustrates an exemplary representation of a waveform generator based on a Digital to Time Converter (DTC), in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE PRESENT INVENTION

Before describing in detail embodiments that are in accordance with the present invention, it should be observed that the embodiments reside primarily in combinations of method steps and apparatus components related to managing digital to time conversion. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the present invention described herein may be comprised of one or more conventional processors and unique stored program instructions that control the one or more processors to implement, in conjunction with certain non-processor circuits, some, most, or all of the functions of method and system for managing digital to time conversion described herein. The non-processor circuits may include, but are not limited to, a radio receiver, a radio transmitter, signal drivers, clock circuits, power source circuits, and user input devices. As such, these functions may be interpreted as steps of a method to perform managing digital to time conversion. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, pursuant to various embodiments, the present invention provides method and system for managing a Digital to Time Conversion (DTC). The present invention facilitates measurement of a quantization or delay error that may occur during DTC. An embodiment of the present invention can further facilitate compensating for the quantization or the delay error so as to obtain an output signal with a higher accuracy.

In accordance with an embodiment of the present invention, a Radio Frequency (RF) signal is phase-shifted to obtain a phase-shifted RF signal. The RF signal is then down converted to obtain an Intermediate Frequency (IF) signal and the phase-shifted RF signal is down converted to obtain a phase-shifted IF signal, based on a desired magnification factor. Further, a time delay between the IF signal and the phase-shifted IF signal is estimated. Subsequently, the phase-shifted RF signal is processed using the time delay in order to obtain a more accurate phase shift in the phase-shifted RF signal. The method of managing the DTC for obtaining a more accurate phase-shifted RF signal is described in detail in conjunction with FIG. 1, FIG. 2, FIG. 3 and FIG. 4 below.

Referring to the drawings, and in particular to FIG. 1, an exemplary representation of a waveform generator 100 based on a DTC is shown, in accordance with an embodiment of the present invention. The waveform generator 100 includes a Radio Frequency (RF) signal generator 102 operatively coupled to a DTC apparatus 104. In an embodiment of the present invention, the waveform generator 100 can be a Direct Digital Synthesizer (DDS). Further, in an embodiment, the RF signal generator 102 can be a Phase Lock Loop (PLL) that can be employed for generating a first RF signal. Those skilled in the art will realize that any RF signal generator may be employed for generating the first RF signal, and all such embodiments are within the scope of the present invention.

Subsequently, the first RF signal is provided as an input to the DTC apparatus 104. The DTC apparatus 104 performs a digital to time conversion of the first RF signal. Consequently, a second RF signal is generated from the DTC apparatus 104 using the first RF signal. The second RF signal is a phase-shifted first RF signal. Similarly, a plurality of phase-shifted first RF signals can be obtained using the DTC apparatus 104. These phase-shifted first RF signals can be combined to obtain an output signal 106. Further, the phase-shifted first RF signals can be combined in various ways to obtain output signals of varying frequencies and/or phases.

In accordance with the present invention, the DTC apparatus 104 manages the digital to time conversion of the first RF signal so as to obtain the output signal 106 with reduced spurious signals. The managing of the digital to time conversion is explained in detail in conjunction with FIG. 2 described below.

Figure 2:
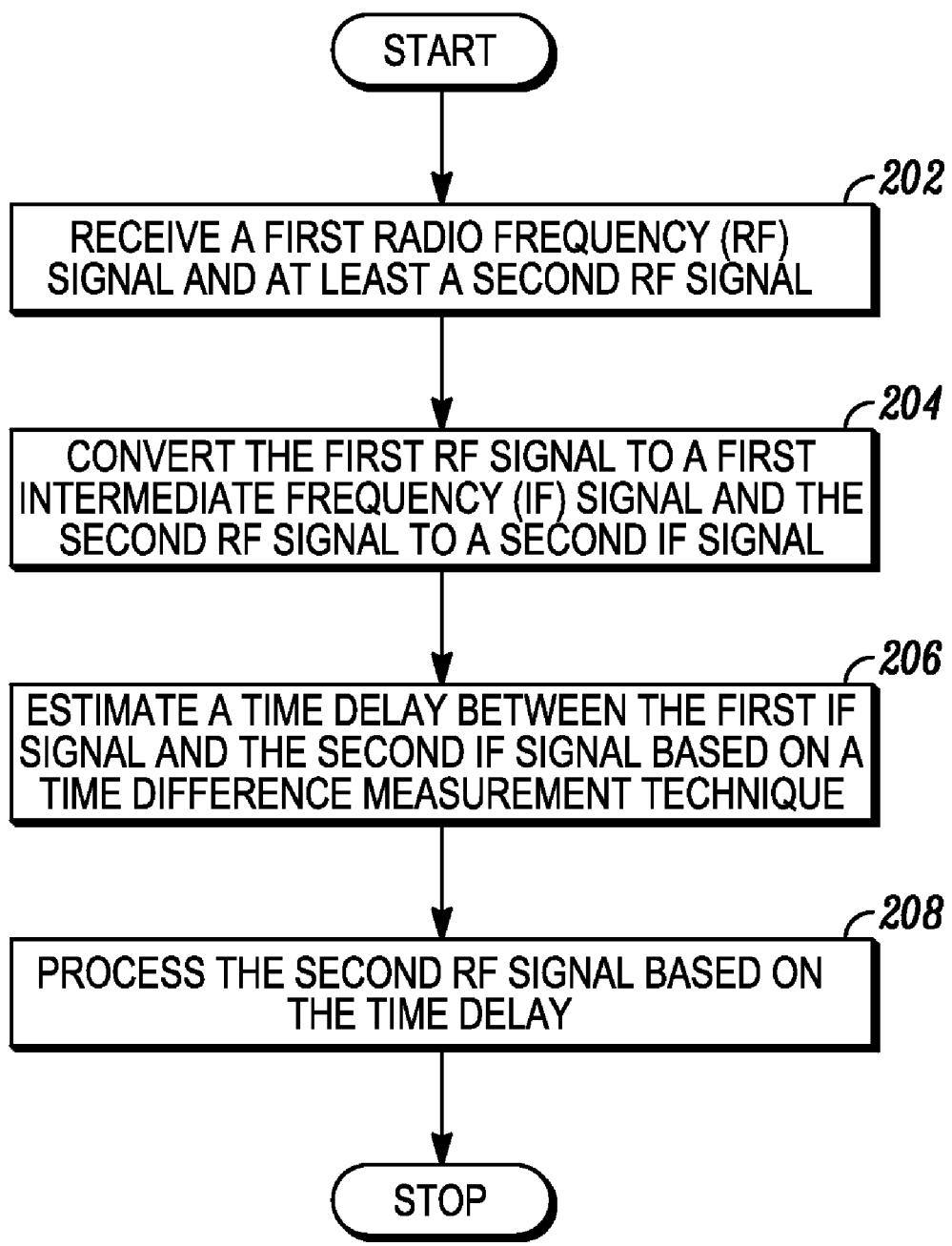
FIG. 2 illustrates a flow diagram of a method for managing digital to time conversion, in accordance with an embodiment of the present invention.

Turning now to FIG. 2, a flow diagram of a method for managing digital to time conversion is shown, in accordance with an embodiment of the present invention. The digital to time conversion may be performed using a Direct Digital Synthesis (DDS) mechanism. A first RF signal and a second RF signal are received at step 202. The second RF signal is a phase-shifted first RF signal. In an embodiment, a PLL may be used to generate the first RF signal and a Delay Locked Loop (DLL) can be employed for generating the second RF signal from the first RF signal. The DLL consists of one or more tap delay elements. When the first RF signal is passed through the one or more tap delay elements of the DLL, based on a delay selection logic programming, the first RF signal is phase-shifted to obtain the second RF signal. For instance, the first RF signal can be passed through one tap delay element to obtain the second RF signal with a tap delay of 1ns. Similarly, the first RF signal may be passed through two tap delay elements to obtain the second RF signal with a tap delay of 2 ns, and so on.

At step 204, the first RF signal is converted to a first IF signal and the second RF signal is converted to a second IF signal. The conversion of the first RF signal to the first IF signal and the second RF signal to the second IF signal is commonly referred to as down conversion. Down conversion of the first RF signal and the second RF signal, which may be in the range of Giga Hertz (GHz), to frequencies in Kilo Hertz (KHz) or Mega Hertz (MHz) enables more manageable and accurate measurements of time delays of RF signals. The step 204 is explained in detail in conjunction with FIG. 3 described below.

Using down conversion, a time delay between the first RF signal and the second RF signal is estimated based on a time difference measurement technique. Accordingly, at step 206 the time delay is estimated between the first IF signal and the second IF signal using a time difference measurement technique. A Dual Mixer Time Difference (DMTD) technique can be implemented for estimating the time delay between the first RF signal and the second RF signal. The DMTD technique is used for magnifying a time resolution by down converting RF signals to IF signals in order to measure time delays with higher precision. In accordance with an embodiment of the present invention, the time resolution to which the RF signal is magnified to may depend on an accuracy requirement. For instance, for a DTC based DDS to be used as a local oscillator in a certain communication system platforms, a stringent specification of −80 dBc spurious signals level may be desired. It will be appreciated by those skilled in the art that this stringent specification can be met with higher precision, if a time delay is measured and corrected for in an IF domain as against a RF domain, which has a lower time resolution than the IF domain.

In an embodiment, one or more zero crossings pertaining to each of the first IF signal and the second IF signal are identified. Subsequently, a time delay between the first IF signal and the second IF signal is counted. Those skilled in the art will realize that this time delay in the IF domain is a magnified version of the time delay in the RF domain. Sub-picosecond resolution in the RF domain can be converted into nanoseconds resolution in the IF domain. Consequently, the time delay between the first IF signal and the second IF signal can be counted with higher accuracy than a time delay between the first RF signal and the second RF signal.

The first RF signal may be used to initiate counting of the time delay between the first IF signal and the second IF signal. A relative measurement of the time delay associated with the first IF signal and different tap delay elements yielding the second IF signal can be used to calculate a delay error of each individual tap delay elements in the DLL. Moreover, in an embodiment of the present invention, the time delay can be stored for retrieval at a later time so as to facilitate compensation for the delay error of the second IF signal. At step 208, the second RF signal is processed based on the time delay to compensate for the delay error of the second RF signal. Similarly, a time delay can be estimated for a plurality of phase-shifted first RF signals and delay errors corresponding to the plurality of phase-shifted first RF signals can be computed, accordingly. The delay errors can be compensated for while combining the plurality of phase-shifted first RF signals to obtain an output signal with a desired frequency and/or phase. Further, the output signal is produced with a reduced number of spurious signals, resulting in a superior quality output signal.

Figure 3:
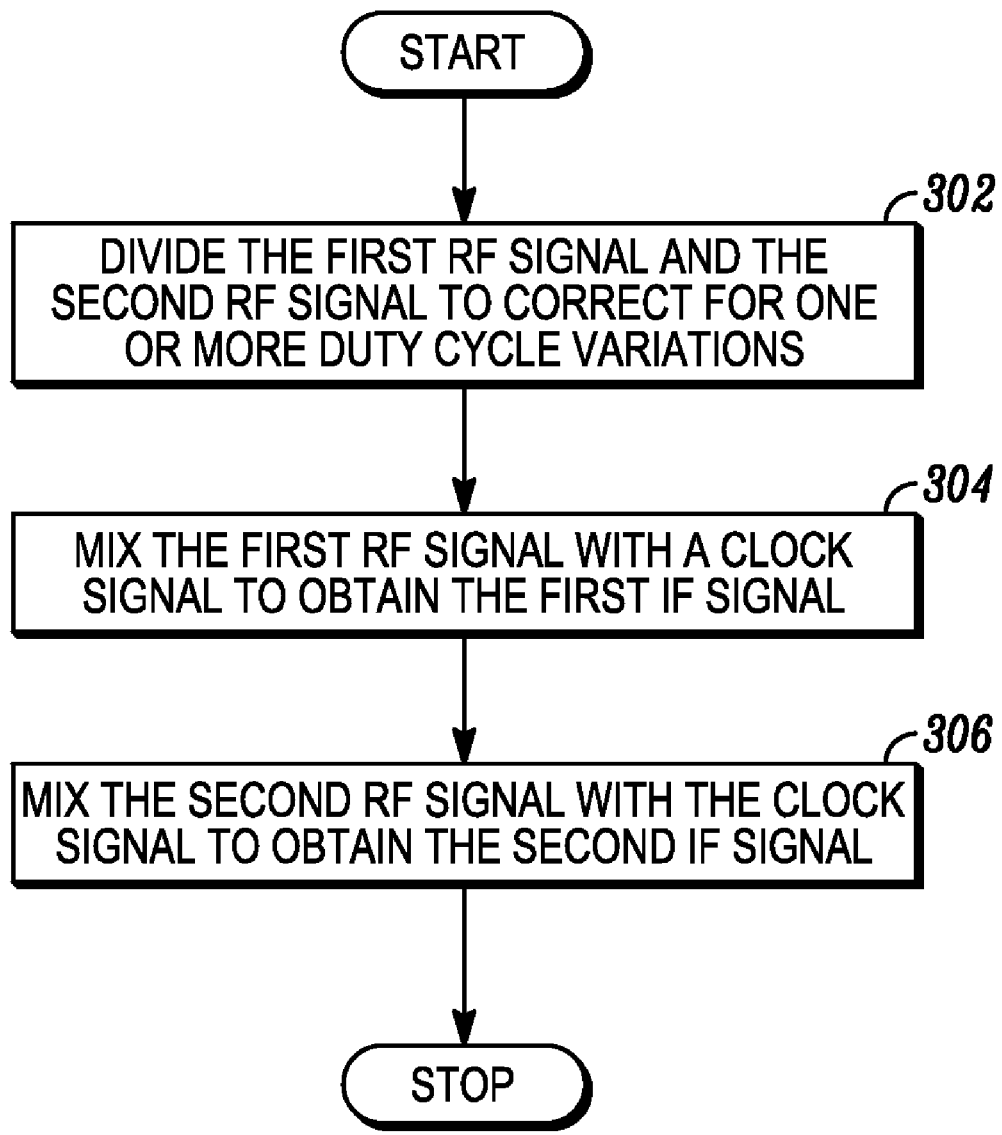
FIG. 3 illustrates a flow diagram of a method for converting a first RF signal to a first Intermediate Frequency (IF) signal and a second RF signal to a second IF signal, in accordance with an embodiment of the present invention.

Turning now to FIG. 3, a flow diagram for converting a first RF signal to a first IF signal and a second RF signal to a second IF signal is shown in accordance with an embodiment of the present invention. As mentioned earlier in conjunction with FIG. 2, the first RF signal is initially phase-shifted to obtain a second RF signal. However, operations such as phase-shifting of RF signals induce variations in duty cycles of the RF signals. Consequently, any relative duty cycle variations in a plurality of phase-shifted RF signals may impact the relative time delay estimation at step 206 of FIG. 2. Therefore, for estimating a more accurate time delay, the first RF signal and the second RF signal can be divided at step 302 to correct for one or more duty cycle variations. Those skilled in the art will realize that other methods for correcting duty cycle variations of the RF signals can also be implemented and are within the scope of the present invention.

The first RF signal and the second RF signal may be high frequency signals, such as in the range of GHz. At these high frequencies, a time delay between the first RF signal and the second RF signal may be inaccurately estimated. Consequently, in accordance with the present invention, the first RF signal is converted to the first IF signal and the second RF signal is converted to the second IF signal. Down conversion of frequencies, for instance in the range of GHz, to frequencies, for instance in the range of KHz or MHz, magnifies the time delay between RF signals and hence enables more accurate measurements of time delays in an IF domain.

Accordingly, at step 304, the first IF signal is obtained by mixing the first RF signal with a clock signal. Similarly, the second IF signal is obtained by mixing the second RF signal with the clock signal at step 306.

The frequency of the clock signal is determined based on a desired predetermined intermediate frequency. The predetermined intermediate frequency is a frequency to which the first RF signal and the second RF signal are down converted to, for achieving a desired magnification factor in the time delay. In other words, the predetermined intermediate frequency is the required frequency of the first IF signal and the second IF signal. The magnification factor is a ratio of the frequency of the first RF signal (or second RF signal) to the frequency of the first IF signal (or the second IF signal). Further, the clock signal can be a signal with frequency equal to a difference between the frequency of the first RF signal (or the second RF signal) and the frequency of the first IF signal (or the second IF signal).

For example, a PLL may be used to generate a first RF signal at a frequency of 1 GHz. When the first RF signal is passed through a DLL, a second RF signal, which is a phase-shifted first RF signal with 1 GHz frequency, can be obtained. To meet, for example, a −80 dBc spurious signal level, a resolution accuracy of 0.035 picoseconds (ps) may be desired in the time delay estimate.

To achieve the 0.035 ps resolution accuracy between the first IF signal and the second IF signal, the first RF signal and the second RF signal can be mixed with the clock signal to obtain the first IF signal and the second IF signal at a predetermined intermediate frequency of 1 MHz. This results in a magnification factor of 1000 and a reduction in a required resolution accuracy of the time delay in the IF domain to 35 ps. Consequently, the accuracy requirement of time resolution corresponding to the time delay can be scaled from 0.035 ps to 35 ps.

Similarly, if the predetermined intermediate frequency is reduced to 10 KHz, the magnification factor becomes 100,000 and the required resolution accuracy of the time delay between the first RF signal and the second RF signal reduces to 3.5 ns. Therefore, down converting the first RF signal and the second RF signal by a factor of 100,000 converts a time resolution at sub-picoseconds dimension to a nanoseconds dimension. The time delay can now be estimated for the second IF signal with the resolution accuracy of 3.5 ns by using the first RF signal and the second RF signal at 1 GHz and with a period of 1ns for counting the time delay.

Figure 4:
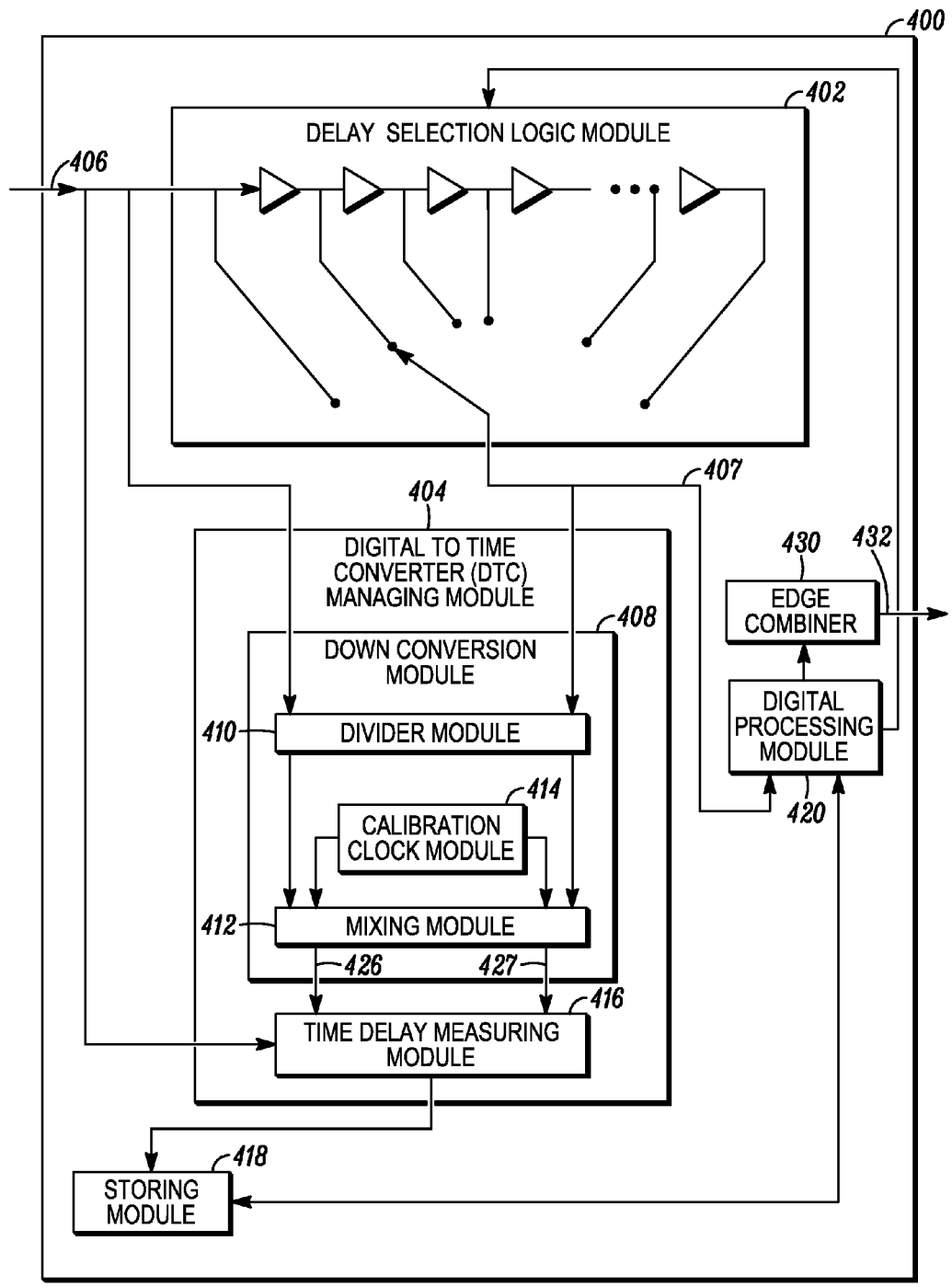
FIG. 4 illustrates a block diagram of an apparatus for managing digital to time conversion, in accordance with an embodiment of the present invention.

Turning to FIG. 4, a block diagram of an apparatus 400 for managing a digital to time conversion is shown in accordance with an embodiment of the present invention. The apparatus 400 can be the DTC apparatus 104 depicted in FIG. 1. The apparatus 400 may be implemented in a DDS mechanism or other electronic apparatuses.

The apparatus 400 includes a delay selection logic module 402 and a DTC managing module 404. In an embodiment of the present invention, the apparatus 400 is integrated on a single chip, providing a complete on-chip solution for time delay measurement and delay error compensation of DTC based DDS system. Further, the single chip may be integrated within a portable radio. The portable radio, in accordance with the present invention, can generate an output signal with a reduced number of spurious signals and, hence, a superior quality.

A first RF signal 406 is received as an input at the apparatus 400. The delay selection logic module 402 is configured to receive the first RF signal 406, and, subsequently, generate a second RF signal 407. The second RF signal 407 is a phase-shifted first RF signal. The delay selection logic module 402 can include an array of tap delay elements. When the first RF signal 406 passes through a tap delay element, the first RF signal 406 is phase-shifted with a tap delay of, for instance 1ns. Similarly, when the first RF signal 406 passes through two tap delay elements, the first RF signal 406 is phase-shifted with a tap delay of, for instance 2 ns, and so on.

The DTC managing module 404 receives the first RF signal 406 and the second RF signal 407. Thereafter, a down conversion module 408 converts the first RF signal 406 to a first IF signal 426 and the second RF signal 407 to a second IF signal 427.

In an embodiment, the down conversion module 408 may optionally include a divider module 410 that can be coupled to a mixing module 412. The divider module 410 is configured to receive the first RF signal and the second RF signal and correct for one or more duty cycle variations in the first RF signal and the second RF signal.

Further, the down conversion module 408 includes a calibration clock module 414 that is configured to generate a clock signal based on a desired predetermined intermediate frequency. As mentioned earlier, the desired predetermined intermediate frequency is a frequency to which the first RF signal 406 and the second RF signal 407 are down converted to, for achieving a desired magnification factor. In other words, the desired predetermined intermediate frequency is the required frequency of the first IF signal 426 and the second IF signal 427. The magnification factor is a ratio of the frequency of the first RF signal 406 (or the second RF signal 407) to the frequency of the first IF signal 426 (or the second IF signal 427). Further, the clock signal can be a signal with frequency equal to a difference between the frequency of the first RF signal 406 (or the second RF signal 407) and the frequency of the first IF signal 426 (or the second IF signal 427).

For example, for the first RF signal 406 of 1 GHz frequency, the calibration clock module 4140 can be configured to generate a clock signal such that the first IF signal 426 and the second IF signal 427 are at an intermediate frequency of 1 MHz. The Mixing module 412 can be configured to mix the first RF signal 406 with the clock signal to obtain the first IF signal 426. Similarly, the mixing module 412 can mix the second RF signal 407 with the clock signal to obtain the second IF signal 427. Upon mixing the first RF signal 406 and the second RF signal 407 with the clock signal, the first IF signal 426 and the second IF signal 427 are obtained, such that with a required frequency for the desired magnification factor is acquired.

Further, the DTC managing module 404 includes a time delay measuring module 416. The time delay measuring module 416 estimates a time delay between the first IF signal 426 and the second IF signal 427 based on a time difference measurement technique. The first RF signal 406 is provided as an input to the time delay measuring module 416 for initiating measurement of the time delay between the first IF signal 426 and the second IF signal 427. In an embodiment, the time difference measurement technique is a Dual Mixer Time Difference (DMTD) technique. The DMTD technique is used for magnifying time resolution by down converting RF signals to IF signals in order to measure time delays with higher accuracy. Further, the time delay can be measured based on a zero crossing detection technique. However, other techniques of measuring the time delay may be employed by the time delay measuring module 416.

For instance, if the first RF signal 406 is generated at 1 GHz, the calibration clock can be configured to generate a clock signal, such that upon mixing the first RF signal 406 and the clock signal, the first IF signal 426 with 1 MHz frequency is obtained. Similarly, the second RF signal 407 can be mixed with the clock signal to obtain the second IF signal 427 at 1 MHz. The magnification factor in this case is 1000. In order to meet, for example, a −80 dBc spurious level, a resolution accuracy of 0.035 ps maybe required in the RF domain. However, due to the magnification factor of 1000, a resolution accuracy of 35 ps is required in the IF domain, when the desired predetermined intermediate frequency is 1 MHz. Similarly, when the desired predetermined intermediate frequency is 10 KHz, a magnification factor of 100,000 is obtained. This results in reduction of the resolution accuracy requirement to 3.5 ns, as against 0.035 ps when there is no down conversion.

The time delay measuring module 416, then, estimates the time delay between the first IF signal 426 and the second IF signal 427. Those skilled in the art will realize that the time delay measuring module 416 may estimate the time delay with a resolution accuracy of 3.5 ns (when the IF is 10 KHz) as against 0.035 ps (when there is no down conversion) and still meet the desired −80 dBc spurious signal level.

Further, in an embodiment of the present invention, apparatus 400 can include a storing module 418 and a digital processing module 420. The storing module 418 is configured to store the time delay between the first IF signal 426 and the second IF signal 427 estimated using the time delay measuring module 416. As mentioned earlier, the second IF signal 427 corresponds to the second RF signal 407, which is a phase-shifted version of the first RF signal 406. Thus, time delays of one or more IF signals corresponding to the phase-shifted versions of the first RF signal 406 can be stored in the storing module 418. The storing module 418 can be, for instance, a Random Access Memory (RAM).

Further, a relative measurement of the time delay associated with each tap of the second IF signal 427 and the first IF signal 426 can be used to calculate a delay error in the second IF signal 427. The delay error can be a difference between a time delay desired between the first IF signal 426 and the second IF signal 427 to obtain a non-spurious output signal, and the actual time delay estimated between the first IF signal 426 and the second IF signal 427 by the time delay measuring module 416. In an embodiment of the present invention, the time delay may be retrieved from the storing module 418 and used for compensating the delay error of the second IF signal 427. In another embodiment, instead of storing the time delays, the delay errors may be stored in the storing module. The delay errors may be associated, for instance, with a circuit path or the tap delay elements of the delay selection logic module 402.

Thereafter, the digital processing module 420 processes the second RF signal 407 based on the time delay or the delay error retrieved from the storing module 418, so as to compensate for the delay error of the second RF signal 407. Processing may further include, for instance, path calibration, offset alignment of the delay selection logic module 402, etc. The time delays and correspondingly, the delay errors, can be estimated in a similar manner for a plurality of phase-shifted versions of the first RF signal 406. Further, the delay errors can be compensated for while combining the plurality of phase-shifted versions of the first RF signal 406 to obtain an output signal with a desired frequency and/or phase. In an embodiment, the digital processing module 420 may process a plurality of phase-shifted versions of the first RF signal 406 to compensate for the delay errors and may send these processed signals to a combining module 430. The combining module 430 may be, for instance, an edge combiner. The combining module 430 may be configured to combining the plurality of phase-shifted versions of the first RF signal 406 to obtain a desired output signal 432. Processing the plurality of phase-shifted versions of the first RF signal 406 prior to combining them ensures that the output signal 432 is generated with a reduced number of spurious signals.

Various embodiments of the present invention provide method and system for managing digital to time conversion. The present invention facilitates estimating a time delay between a reference RF signal and a phase-shifted reference RF signal with higher accuracy. Using the time delay estimate, a time delay offset that may occur during the synthesis of the phase-shifted RF signals can be appropriately compensated. Consequently, the present invention facilitates a DTC based DDS mechanism to generate high quality RF signals that can meet stringent quality requirements with reduced spurious signals.

What is claimed is:

1. A method for managing Digital to Time Conversion (DTC), the method comprising:
   receiving a first Radio Frequency (RF) signal and at least a second RF signal, wherein the second RF signal is a phase-shifted first RF signal;
   converting the first RF signal to a first Intermediate Frequency (IF) signal and the second RF signal to a second IF signal;
   estimating a time delay between the first IF signal and the second IF signal based on a time difference measurement technique; and
   processing the second RF signal based on the time delay, wherein processing the second RF signal corresponds to compensating for a delay error in the second RF signal.

2. The method of claim 1, wherein the converting step comprising:
   mixing the first RF signal with a clock signal to obtain the first IF signal; and mixing the second RF signal with the clock signal to obtain the second IF signal.

3. The method of claim 2, further comprising dividing the first RF signal and the second RF signal to correct for one or more duty cycle variations.

4. The method of claim 2, wherein the clock signal is generated based on a predetermined intermediate frequency.

5. The method of claim 1, wherein the time delay between the first IF signal and the second IF signal is stored.

6. The method of claim 5, wherein the processing step comprises retrieving the time delay between the first IF signal and the second IF signal.

7. The method of claim 4, wherein the predetermined intermediate frequency is determined based on a desired magnification factor.

8. The method of claim 1 further comprises combining a plurality of second RF signals to obtain an output signal, wherein the plurality of second RF signals comprises at least the second RF signal.

9. The method of claim 1, wherein DTC corresponds to a Direct Digital Synthesis (DDS) mechanism.

10. The method of claim 1, wherein the time difference measurement technique is a Dual Mixer Time Difference (DMTD) technique.

11. An apparatus for managing a Digital to Time Converter (DTC), the apparatus comprising:
    a delay selection logic module, the delay selection logic module configured to:
        receive a first RF signal; and
        generate at least a second RF signal from the first RF signal, wherein the
        second RF signal is a phase-shifted first RF signal; and
    a DTC managing module operatively coupled to the delay selection logic module, the DTC managing module configured to receive the first RF signal and the second RF signal, the DTC managing module comprising:
        a down conversion module, the down conversion module converting the first RF signal to a first IF signal and the second RF signal to a second IF signal; and
        a time delay measuring module, the time delay measuring module estimating a time delay between the first IF signal and the second IF signal based on a time difference measurement technique.

12. The apparatus of claim 11, wherein the down conversion module comprises:
    a calibration clock module, the calibration clock module configured to generate a clock signal, wherein the clock signal is generated based on a predetermined intermediate frequency; and
    a mixing module, the mixing module configured to:
        mix the first RF signal with the clock signal to obtain the first IF signal; and
        mix the second RF signal with the clock signal to obtain the second IF signal.

13. The apparatus of claim 12, further comprising a divider module coupled to the mixing module, wherein the divider module is configured to:
    receive the first RF signal and the second RF signal; and
    correct for one or more duty cycle variations in the first RF signal and the second RF signal.

14. The apparatus of claim 11 further comprising:
    a storing module, the storing module configured to store the time delay between the first IF signal and the second IF signal; and
    a digital processing module, the digital processing module configured to:
        retrieve the time delay between the first IF signal and the second IF signal; and
        process the second RF signal based on the time delay, wherein processing the second RF signal corresponds to compensating for a delay error in the second RF signal.

15. The apparatus of claim 14 further comprises a combining module, the combining module configured to combine a plurality of phase shifted first RF signals to obtain an output signal, wherein the plurality of first RF signals comprise at least the second RF signal.

16. The apparatus of claim 11, wherein the delay selection logic module and the DTC managing module are integrated on a single chip.

17. The apparatus of claim 15, wherein the single chip is integrated within a portable radio.

18. The apparatus of claim 11, wherein the apparatus is used in a Direct Digital Synthesis (DDS) mechanism.

19. The apparatus of claim 11, wherein the time difference measurement technique is a Dual Mixer Time Difference (DMTD) technique.

* * * * *

UNITED STATES PATENT AND TRADEMARK OFFICE
CERTIFICATE OF CORRECTION

PATENT NO. : 8,339,295 B2  
APPLICATION NO. : 11/831465  
DATED : December 25, 2012  
INVENTOR(S) : Nagaraj et al.

Page 1 of 1

It is certified that error appears in the above-identified patent and that said Letters Patent is hereby corrected as shown below:

On the Title Page, in Item (56), under "OTHER PUBLICATIONS", in Column 2, Line 5, delete "Manuel Moto" and insert -- Manuel Mota --, therefor.

On the Title Page, in Item (56), under "OTHER PUBLICATIONS", in Column 2, Line 5, delete "Iterpolator" and insert -- Interpolator --, therefor.

On the Title Page, in Item (56), under "OTHER PUBLICATIONS", in Column 2, Line 6, delete "lockedloop" and insert -- locked loop --, therefor.

In the Claims

In Column 9, Line 32, in Claim 11, delete "second RF............signal; and" and insert the same on Line 31, after "wherein the".

Signed and Sealed this  
Twenty-first Day of May, 2013

Teresa Stanek Rea  
*Acting Director of the United States Patent and Trademark Office*